United States Patent [19]

Baumann

[11] Patent Number: 4,488,080
[45] Date of Patent: Dec. 11, 1984

[54] PIEZOELECTRICAL CONTROL ELEMENT

[75] Inventor: Rainer Baumann, Bruchkoebel, Fed. Rep. of Germany

[73] Assignee: Honeywell G.m.b.H., Frankfurt am Main, Fed. Rep. of Germany

[21] Appl. No.: 492,980

[22] Filed: May 9, 1983

[30] Foreign Application Priority Data

May 17, 1982 [DE] Fed. Rep. of Germany ....... 3218576

[51] Int. Cl.³ .......................................... H01L 41/08
[52] U.S. Cl. .................................... 310/328; 310/346
[58] Field of Search ................................ 310/328, 346

[56] References Cited

U.S. PATENT DOCUMENTS

| 3,461,910 | 8/1969 | Selsam et al. | 310/328 X |
| 3,766,415 | 10/1973 | Dame et al. | 310/328 |
| 4,160,184 | 7/1979 | Ljung | 310/328 |
| 4,342,935 | 8/1982 | Kallmeyer et al. | 310/328 |
| 4,384,230 | 5/1983 | Wisner | 310/328 X |

Primary Examiner—Mark O. Budd
Attorney, Agent, or Firm—Robert A. Pajak

[57] ABSTRACT

A piezoelectrical control element consists of a package comprising a plurality of piezoceramic disks piled onto each other and of intermediately arranged electrodes whereat the package is loosely piled up and mechanically biased and held together by a resilient element.

7 Claims, 5 Drawing Figures

PIEZOELECTRICAL CONTROL ELEMENT

The present invention relates to a piezoelectrical control element. Such control elements are used in the whole field of optics, electron microscopic optics, micromechanics, in the manufacturing of integrated circuits, in the field of precision valves, in the field of ultrasonics etc. A particular field of use is given for ring laser gyros where such control elements are provided for the path length control of the resonator body or as dither motors. Such control elements shall have displacement strokes in the order of 100 μm and displacement forces exceeding 20,000 N. Furthermore, those elements shall be remotely controllable, and they shall allow mechanical displacements without any vibrations. The resolution of them shall be better than 10-9 m and their sensitivity shall be better than 10-10 m. It shall be possible to use them in a high vacuum environment, and they shall be free of any hysteresis, and they must operate creepage-proof. Regulating speeds are requested which exceed 10 μm per $10^{-3}$ second. The displacement stroke shall be strongly proportional to the applied electrical signal so that the use of any motion pickups is not necessary.

Piezoelectrical control elements which substantially fulfill all of these requests were not known until now. In order to produce high displacement forces at large displacement strokes, as yet piezoelectrical 33 pile drives are used. In those known pile drives the piezoceramic disks are connected to each other by means of a conductive epoxy adhesive, and the electrodes consist of metal films embedded in the adhesive. Pile drives designed in this way show a great additional displacement as a function of temperature due to the great thermal expansion of the epoxy adhesive. Furthermore the properties of the adhesive itself are strongly dependent on temperature and the adhesive has a mechanical hysteresis due to its partial plasticity. Moreover adhesive is gassing out and therefore is not appropriate for an application in a high vacuum environment. Due to the elastical and plastical behavior of the adhesive intermediate layers within the pile, the displacement stroke, the displacement force, the regulating velocity, the sensitivity and the resolution are reduced to a great extent. Furthermore the adhesive layers are inhomogeneous and may burst at high oscillation amplitudes.

It is, therefore, the object of the present invention to provide a piezoelectrical control element which has high displacement forces at large displacement strokes, which is creepage-proof and free of hysteresis, which shows high resolution, sensitivity and regulating velocities and which is appropriate for use in a high vacuum environment. This object is achieved by mechanically biasing a loosely piled stack of piezoelectrical elements by use of a resilient element.

Figure 1:
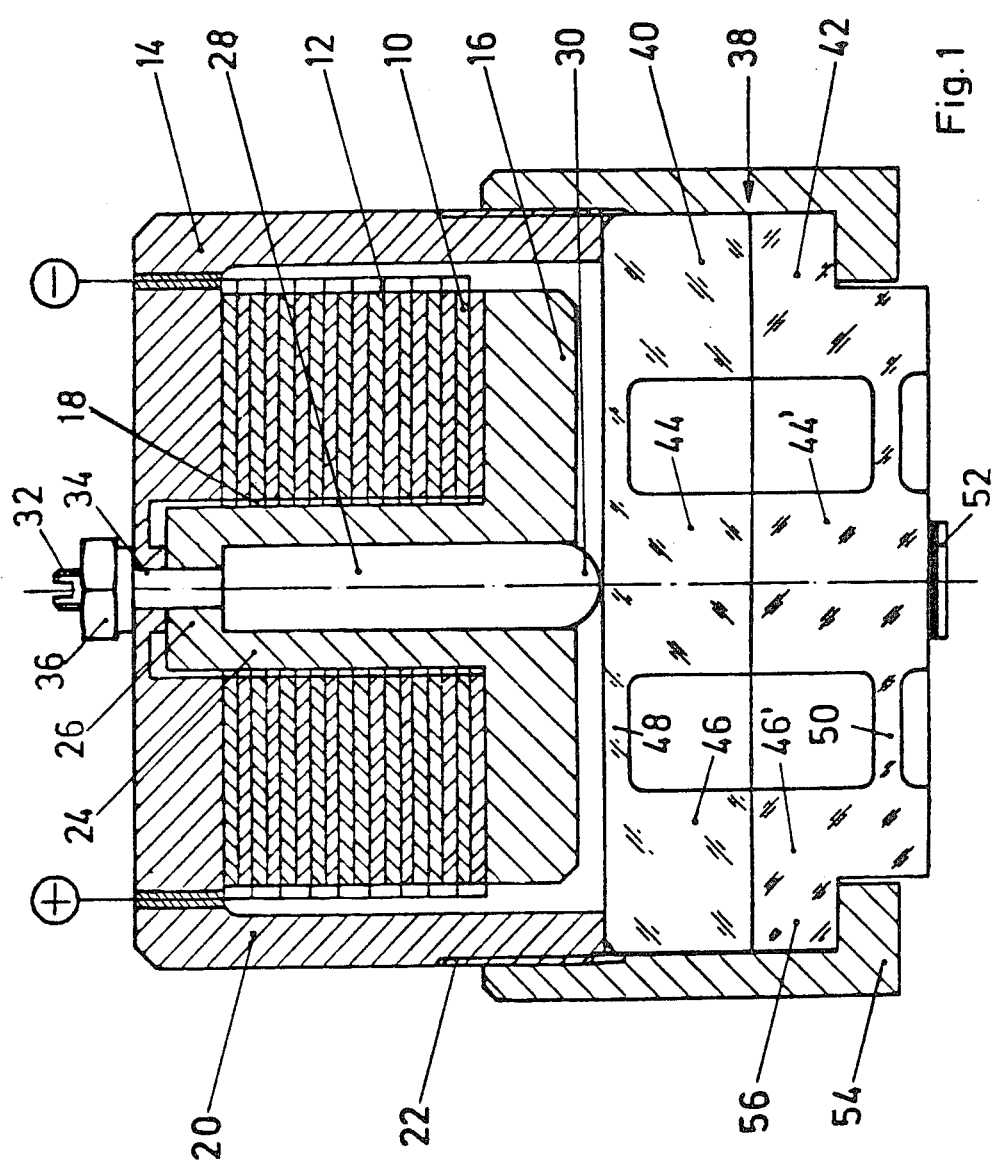
FIGS. 1–5 show cross section diagrams of several embodiments of the present invention.

According to FIG. 1, a pile of piezoceramic disks 10 with intermediately arranged electrodes 12 is provided between a base plate 14 and a back-pressure plate 16. The piezoceramic disks 10 and the electrodes 12 are provided with central recesses 18. The base plate 14 extends to a cylindrical wall 20 with said wall being provided with a thread 22 at its outside and with said wall encircling the piezo pile and the back-pressure plate 16. The back-pressure plate 16 comprises a tube-shaped extension 24 extending above through the recesses 18. Against a shoulder 26 in the tube-shaped extension 24, a push rod 28 abuts which projects with its lower end 30 over the back-pressure plate 16 and which is ball-shaped at this end. The push rod 28 further extends with its upper end being designed as a threaded pin 32 through a bore 34 in the base plate 14, whereat the base plate in the environment of the bore 34 is strongly reduced in its thickness. A nut 36 urges the push rod 28 against the shoulder 26 in the tube-shaped extension 24 so that the back-pressure plate 16 pushes the piezo pile 10, 12 against the base plate 14.

The device consisting of the cup-shaped housing 14, 20, the back-pressure plate 16 with the tube-shaped extension 24 and the push rod 28 and the intermediately arranged piezo pile 10, 12 forms a unit which may be handled separately, whereat the piezo pile is held together by means of the resilient and mechanical biasing without using adhesive. The electrodes 12 are evaporated on, sputtered on or burned in the piezoceramic disks, and they are alternatively connected to each other by means of intermediately arranged metal films or by means of a particular shaping.

The housing 14, 20 and the push rod 28 are preferably made from a metal having a slow thermal expansion coefficient, e.g. from super invar. On the other hand the back-pressure plate 16 together with the tube-shaped extension 24 is made from the same piezoceramic material as the disks 10 so that a temperature-responsive length expansion of the piezo pile is compensated by an appropriate temperature-responsive length expansion of the tube-shaped extension 24.

The push rod 28 abuts with its ball-shaped lower end 30 against a double diaphragm cylinder 38 consisting of two pieces. This double diaphragm cylinder 38 consists of two axially symmetrical halves 40 and 42 being E-shaped in cross section, whereat the three legs are in optical contact and are held together by adhesive power. The junctions between the enlarged central legs 44, 44' and the ring-shaped outer legs are formed by ring diaphragms 48 and 50. On the free surface of the lower central leg 44' a dielectrical multilayer mirror 52 is provided. The double diaphragm cylinder 38 consists of Zerodur and forms an element being parallel displaceable by the pile drive with this element being particularly used as a path length controller for the resonator in ring laser gyros.

By means of a screw cap 54 which is inserted with its inner thread into the outer thread 22 of the cylindrical housing wall 20 and which is creeping over a ring flange 56 of the upper or lower Zerodur cylinder 40 or 42, respectively, the double diaphragm cylinder 38 is urged against the push rod 28.

Figure 2:
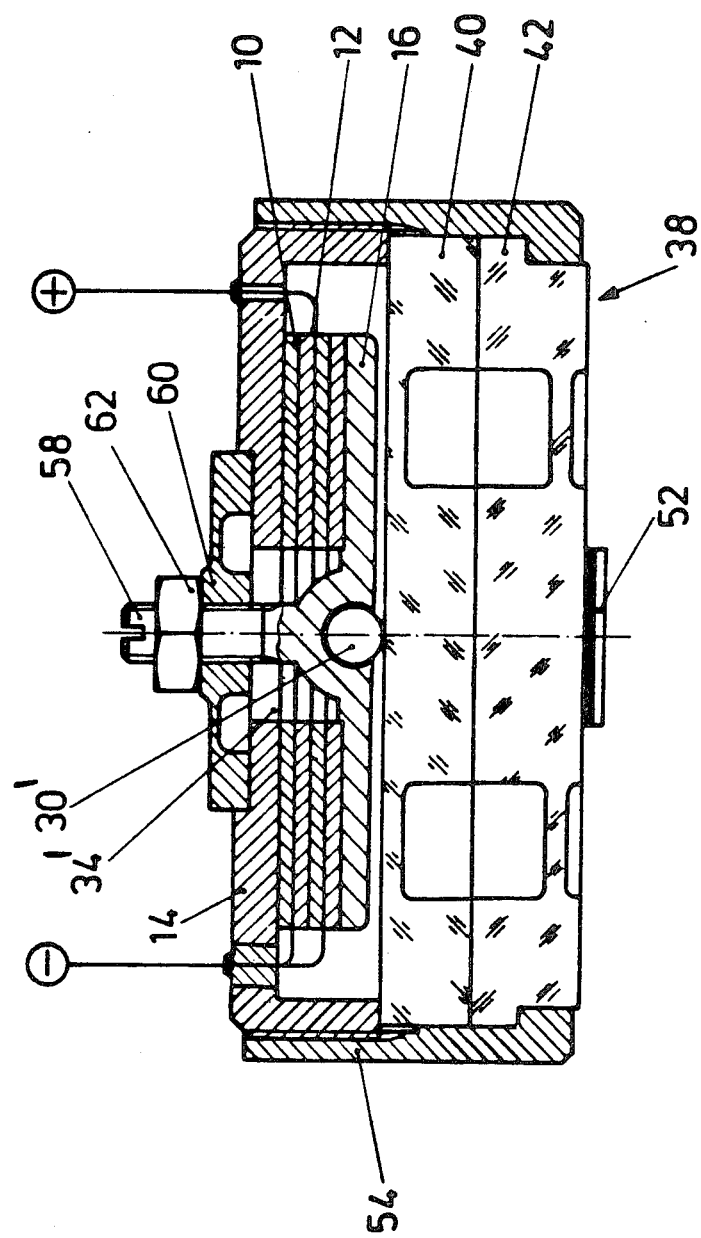

The push control element according to FIG. 2 differs from that of FIG. 1, in particular by a piezo pile having a smaller total height and resulting therefrom by a renunciation of an exact passive compensation of thermal expansion. A coarse passive compensation of thermal expansion is made by the selection of an appropriate metal for the base plate cup 14. As far as here and in the following embodiments components are used which correspond to the components in FIG. 1, those components are provided with the same reference numbers. Components having the same function but being modified in design are provided with an apostrophe.

Deviating from FIG. 1, the back-pressure plate 16 is provided with a threaded pin 58 extending into an enlarged bore 34' in the base plate 14. A ball 30' is inserted in the bottom of the back-pressure plate with said ball abutting against the double diaphragm cylinder 38. A tension spring nut 60 is adjustable on the threaded pin 58, whereat it abuts resiliently against the base plate 14. If the piezo pile is accordingly resiliently biased, the tension spring nut 60 is secured in its position by a lock nut 62.

Figure 3:
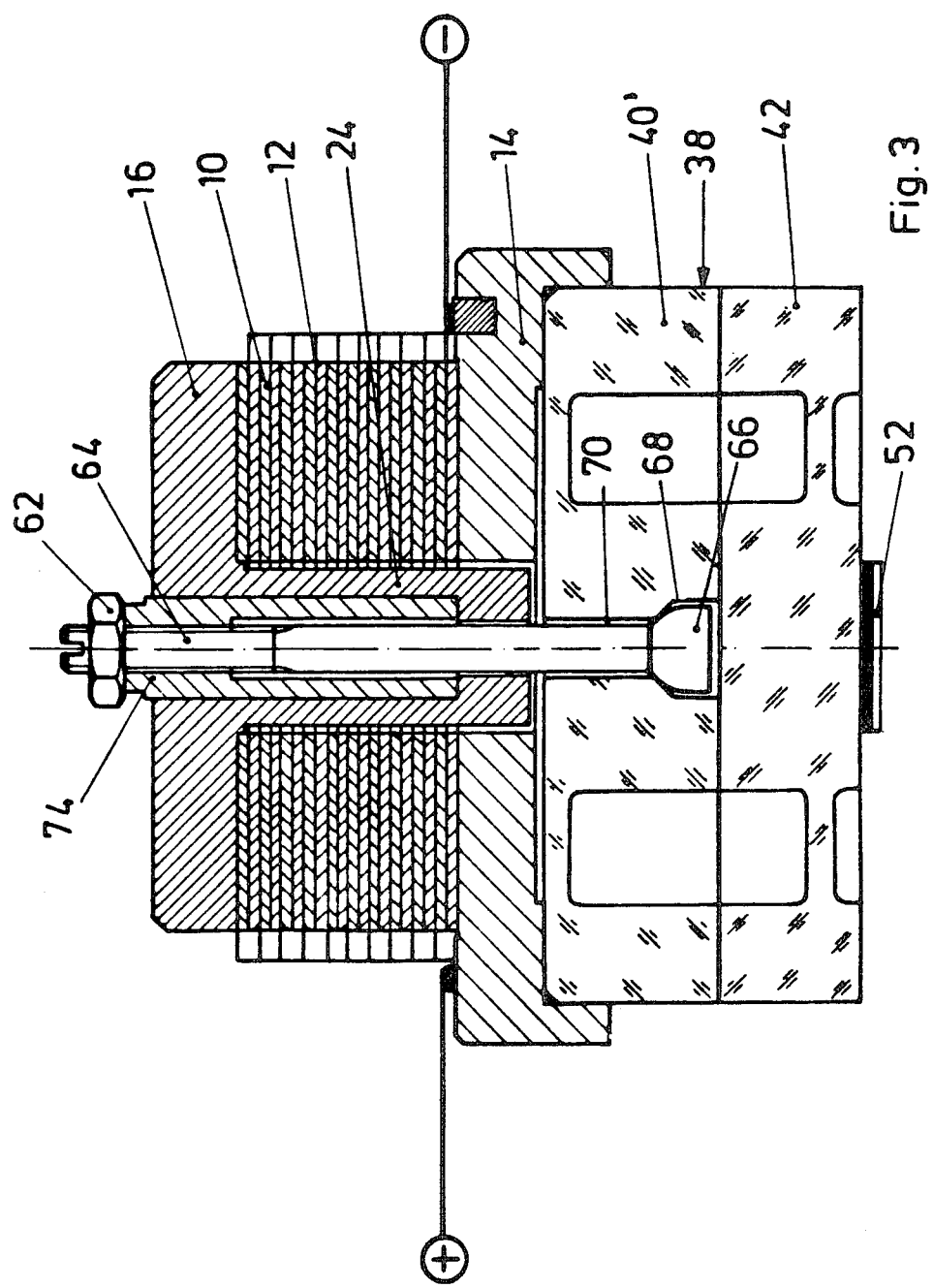

In the pull control element according to FIG. 3 the base plate 14 and the back-pressure plate 16 essentially have changed their positions, and a pull rod 64 is provided which by means of a ball head 66 acts upon the upper half 40' of the double diaphragm cylinder 38. Accordingly the upper half 40' of the Zerodur cylinder is provided with a recess 68 and a central bore 70. The pull rod 64 comprises in its upper portion a thread which acts together with a threaded sleeve 74 abutting against the tube-shaped extension 24 in order to adjust the biasing of the piezo pile. Herewith the spring is provided by means of the double diaphragm cylinder 38. The lock nut 62 secures the threaded sleeve 74.

In the present embodiment the piezo pile fixed between the base plate 14 and the back-pressure plate 16 may not be handled separately; moreover the double diaphragm cylinder 38 is necessary in order to resiliently bias the piezo pile (integrated design).

Figure 4:
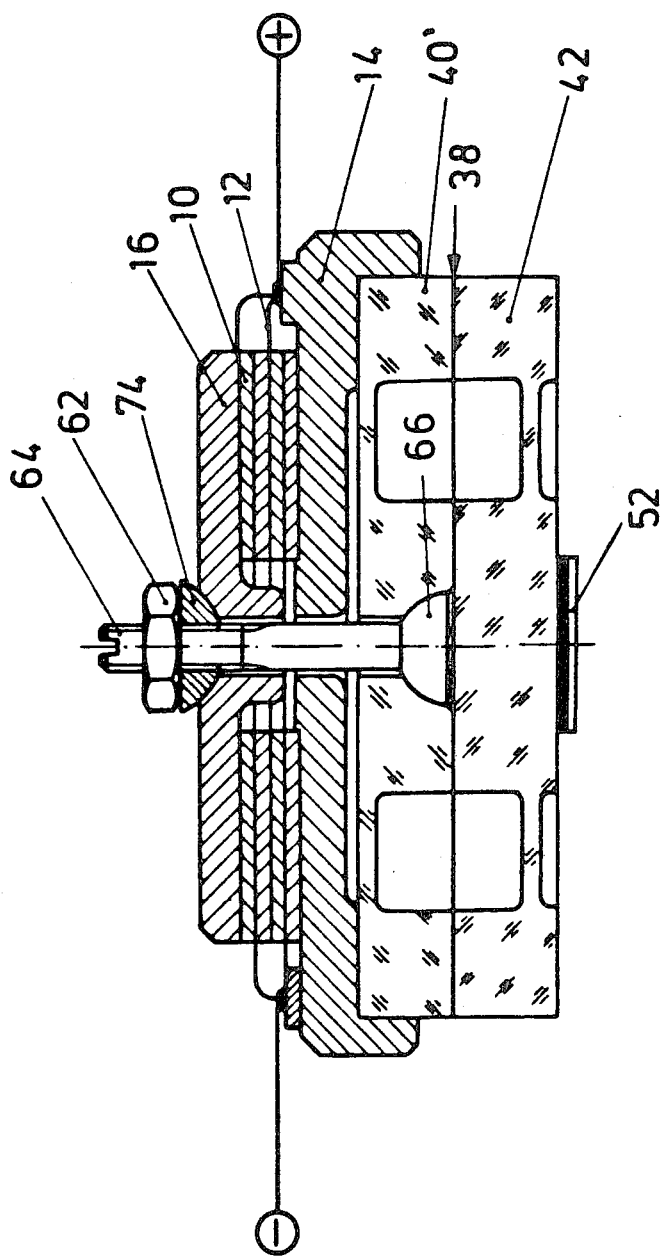
Figure 5:
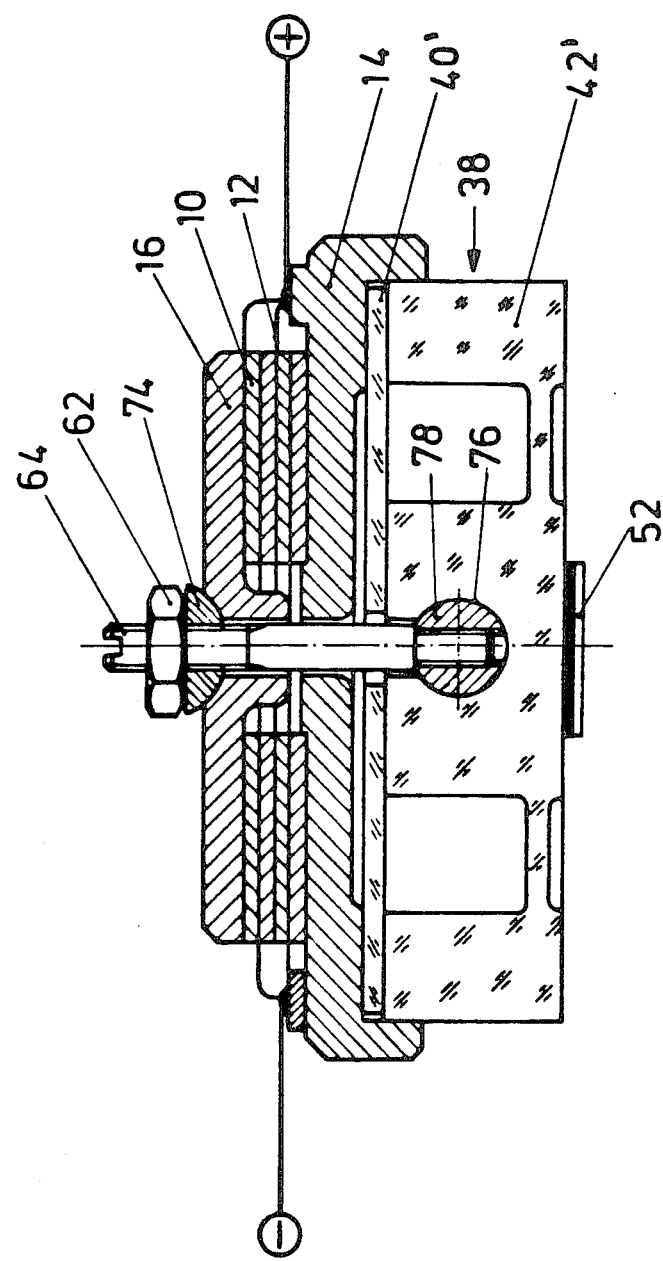

The pull control elements according to FIGS. 4 and 5 differ from those according to FIG. 3 essentially again by a piezo pile having a smaller total height and therefore by renunciation of an exact passive compensation of thermal expansion. In the selection of an appropriate metal for the pull rod 64 a coarse passive compensation of thermal expansion is achieved. Furthermore, with this embodiment a universal joint support for the pull rod 64 is provided.

According to FIG. 4, a hemispherical biasing nut 74 abuts against an appropriately shaped central cutout in the back-pressure plate 16 and the thread of the pull rod 64 is creeping in said biasing nut. The biasing nut 74 resiliently biases the back-pressure plate 16 against the piezo pile, whereat the double diaphragm cylinder 38 again provides the spring force. The lock nut 62 herewith secures the hemispherical biasing nut 74.

Whereas in the embodiments according to FIGS. 3 and 4 the optical contact between both halves 40' and 42' of the double diaphragm cylinder 38 is under a tensile load, FIG. 5 shows an embodiment at which the optical contact on a pull control element is only under compressive load.

Hereto a modification of the lower half 42' of the double diaphragm cylinder 38 is necessary in such a way that the Zerodur cylinder is laterally provided with a diametrical bore 76. Into said bore 76 a ball or cylinder nut 78 is inserted into which the pull rod 64 is threaded from above. The upper half consists of a plate 40' which is connected fixedly to the lower half 42' by means of an optical contact or gold diffusion.

The embodiments of the invention in which an exclusive property or right is claimed are defined as follows:

1. A piezoelectrical control element comprising:
    a loosely piled stack of at least two piezoelectrical elements and intermediately arranged electrodes, said stack having a central passing through recess;
    base plate means;
    back-pressure plate means having a central portion extending through said central passing through recess;
    said stack sandwiched between said base plate means and said back-pressure plate means;
    resilient means for displaceably biasing said back-pressure plate means relative to said base means; and
    coupling means having a curved end portion abutting said resilient means for coupling said back-pressure plate means and said resilient means.

2. The control element of claim 1 wherein said back-pressure plate is comprised of the same material as said piezoelectrical elements.

3. A piezoelectrical control element comprising:
    a loosely piled stack of at least two piezoelectrical elements and intermediately arranged electrodes, said stack having a central passing through recess;
    base plate means;
    back-pressure plate means having a central portion extending through said central passing through recess; and
    said stack sandwiched between said base plate means and said back-pressure plate means;
    resilient means having a double diaphragm means for displaceably biasing said back-pressure plate means relative to said base plate means;
    coupling means for coupling said back-pressure plate means and said double diaphragm.

4. The apparatus of claim 3 wherein said coupling means includes a spherical end portion abutting said double diaphragm.

5. The apparatus of claim 3 wherein said back-pressure plate means is of the same material as said piezoelectrical elements.

6. The control element of claim 3 wherein said diaphragm means includes a first means having a diaphragm and a second means also having a diaphragm, said first and second means coupled to function in unison.

7. The control element of claim 6 wherein said diaphragm means consists of Zerodur and both of said first and second means are in optical contact or are connected with each other by means of a gold diffusion process.

* * * * *